United States Patent
Zortea

[19]

[11] Patent Number: 5,844,439
[45] Date of Patent: Dec. 1, 1998

[54] DC RESTORATION CIRCUIT FOR MULTI-LEVEL TRANSMISSION SIGNALS

[75] Inventor: Anthony E. Zortea, Pipersville, Pa.

[73] Assignee: Integrated Circuit Systems, Inc., Valley Forge, Pa.

[21] Appl. No.: 596,885

[22] Filed: Mar. 13, 1996

[51] Int. Cl.$^6$ ........................................ H03L 5/00
[52] U.S. Cl. .................. 327/307; 375/287; 375/319; 375/219
[58] Field of Search ..................... 375/317, 319, 375/377, 219, 287, 257; 327/362, 363, 307, 45, 44, 39, 312, 323, 321, 332; 455/14, 67.1, 226.1, 234.1, 234.2

[56] References Cited

U.S. PATENT DOCUMENTS

| | | | |
|---|---|---|---|
| 4,093,876 | 6/1978 | Henein et al. | 327/307 |
| 4,142,110 | 2/1979 | Weber | 327/307 |
| 4,373,140 | 2/1983 | Chin . | |
| 4,691,235 | 9/1987 | Okui et al. . | |
| 4,829,267 | 5/1989 | Sandusky . | |
| 4,991,034 | 2/1991 | Sato | 360/67 |
| 5,355,356 | 10/1994 | Johann et al. . | |
| 5,426,389 | 6/1995 | Webster | 327/170 |
| 5,465,272 | 11/1995 | Smith | 375/295 |
| 5,486,869 | 1/1996 | Cooper . | |
| 5,663,998 | 9/1997 | Neustadt | 327/307 |

FOREIGN PATENT DOCUMENTS

| | | | |
|---|---|---|---|
| 004201194 A1 | 7/1993 | Germany | 327/307 |

*Primary Examiner*—Jason Chan
*Assistant Examiner*—Jean B Corrielus
*Attorney, Agent, or Firm*—Townsend and Townsend and Crew LLP

[57] ABSTRACT

A DC restoration circuit to correct for baseline wandering in a data receiver is provided. A voltage correction circuit is connected to the received data line to adjust the voltage level of the received data dynamically. The voltage correction circuit is controlled by a feedback circuit which includes a voltage detection circuit configured to detect the peak voltage levels or envelope of the received data. This detected level is then compared to a reference level, and the result of the comparison is used as a control signal for the voltage correction circuit.

10 Claims, 7 Drawing Sheets

DC RESTORATION CIRCUIT FOR MULTI-LEVEL TRANSMISSION SIGNALS

BACKGROUND OF THE INVENTION

The present invention relates to DC restoration circuits for data transmissions, and in particular for multi-level transmission-3 (MLT-3) signals in Ethernet 100Base-TX systems.

In multi-level transmission systems, rather than a digital high and low value for data, multiple levels can be used to encode data. In an MLT-3 system, three levels can be used, a high, middle and low. The high level could be considered a positive, the middle a zero and the low a negative, for instance. The use of multiple levels, rather than two levels, makes the levels closer to each other and thus more susceptible to noise and any variation in the DC reference or level value.

One phenomenon that is a problem in Ethernet systems is that of "baseline wander." The transformers used for the data lines can introduce baseline wander into a received signal. This baseline wander can vary over time, and can vary the low frequency content of the received signal at rates up to 100 KHz. Such a variance can cause errors in the detected data.

One technique for correcting for baseline wander involves converting the data into digital form, then performing a low pass filtering of a copy of the data and adding the filter version back to the original signal for correcting.

It would be desirable to have a simpler form of correction for baseline wandering that also does not require conversion into digital form, and is not dependent on gain, temperature or other IC process variations.

SUMMARY OF THE INVENTION

The present invention provides a DC restoration circuit to correct for baseline wandering in a data receiver. A voltage correction circuit is connected to the received data line to adjust the voltage level of the received data dynamically. The voltage correction circuit is controlled by a feedback circuit which includes a voltage correction circuit configured to detect the wander of the voltage levels or envelope of the received data. This detected level is then compared to a reference level, and the result of the comparison is used as a control signal for the voltage correction circuit.

In a preferred embodiment, the peak detector has a response time which is greater than a DC wander rate of 100 KHz, and lower than a slowest expected data rate of approximately 2 MHz. The comparison circuit is preferably an operational transconductance amplifier that compares the peak detected voltage to the reference voltage, and outputs a difference current. The difference current is used to charge a capacitor which is buffered and resistively added to a node on the input data line. The input data line passes through another resistor, and thus the ratio of the resistors can be adjusted to provide the desired summing weight.

For a fuller understanding of the nature and advantages of the invention, reference should be made to the following description taken in conjunction with the accompanying drawings.

DESCRIPTION OF THE PREFERRED EMBODIMENT

Figure 1:
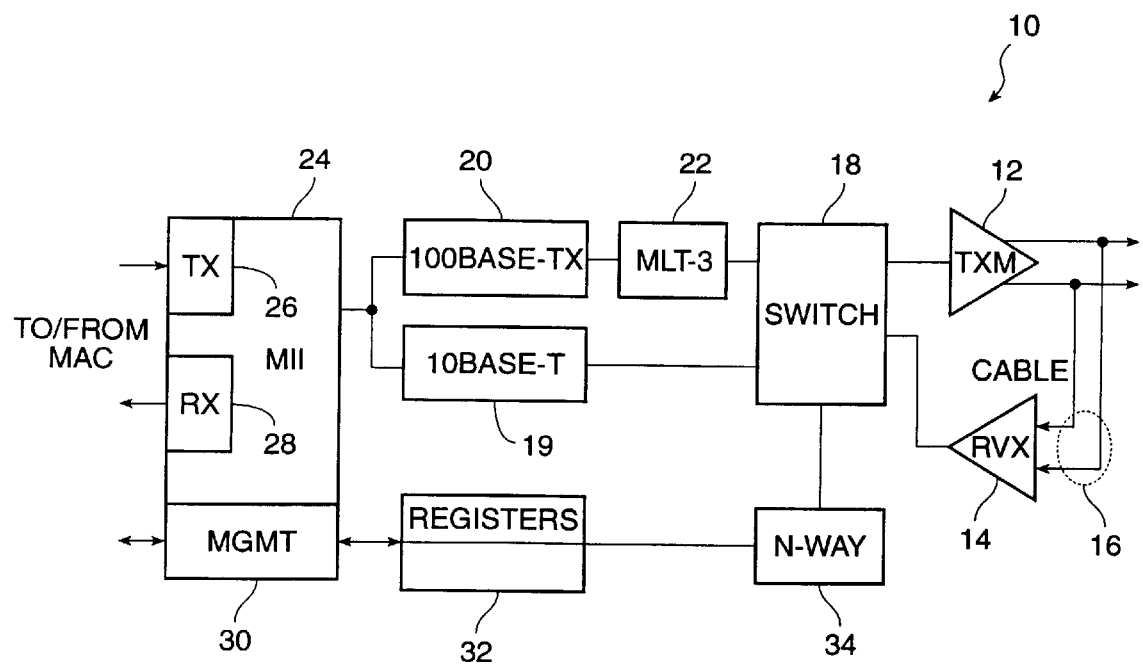
FIG. 1 is a block diagram of one embodiment of a transceiver circuit incorporating the present invention.

FIG. 1 is a block diagram of one embodiment of a physical layer transceiver circuit 10 incorporating the present invention. A transmitter driver circuit 12 and a receiver circuit 14 are connected to a cable 16. These are provided to a switching circuit 18, which chooses a 10Base-T circuit 19 for 10 megabits transmissions, and a 100Base-TX circuit 20 for 100 megabits per second applications. The 100 megabits application also includes an MLT-3 decoder circuit 22 which incorporates the present invention.

A management circuit 24 couples to the MAC layer through its transmitter 26 and receiver 28. Management circuitry 30 through registers 32 controls N-WAY circuit 34, which selects the path through switch 18.

Figure 2:
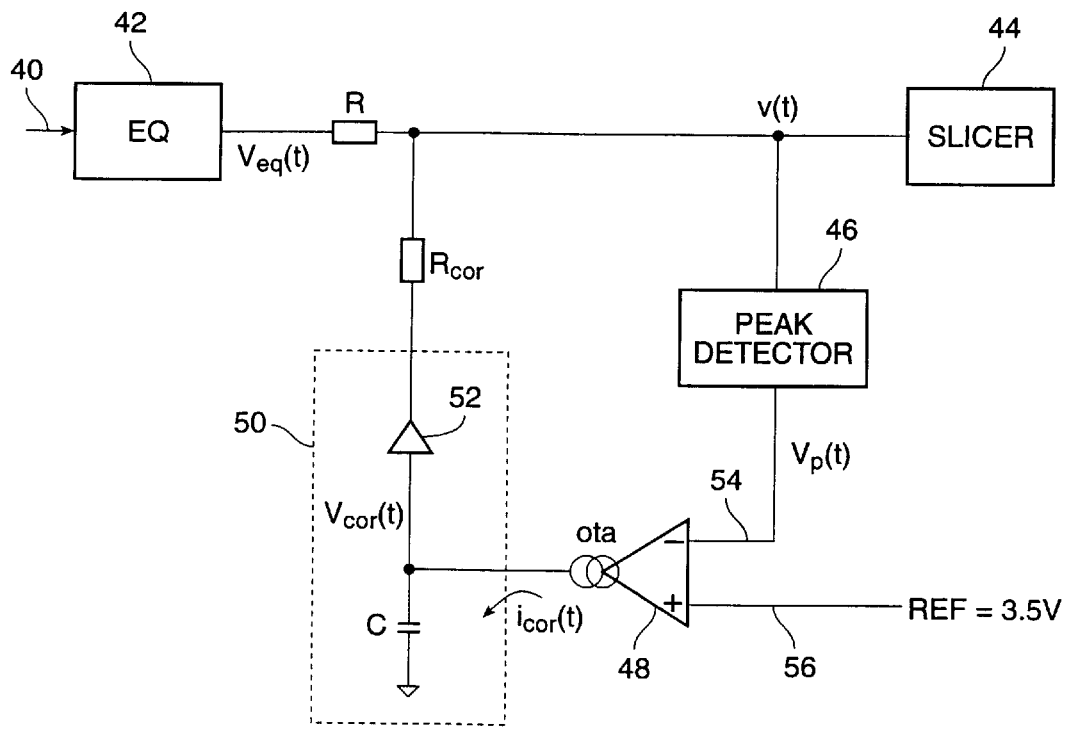
FIG. 2 is a block diagram of one embodiment of a DC restoration circuit according to the present invention.

FIG. 2 is a block diagram of one embodiment of a DC restoration circuit according to the present invention, which would be incorporated into MLT-3 block 22 of FIG. 1, in one embodiment. Input data on a line 40 is provided to an equalizer circuit 42 which corrects for high frequency variations in transmission speed over the transmission medium. The output of the equalizer is a data value indicated by voltage $v_{eq}(t)$. This signal passes through a first resistor R to produce a signal v(t) which is provided as an input to a slicer circuit 44. Circuit 44 clamps the data signal to remove any high-frequency noise.

The present invention provides a feedback loop through a baseline wander (peak) detector 46, a comparison circuit 48 and a voltage correction circuit 50. Circuit 50 is composed of a capacitor C and a buffer 52. A second resistor, $R_{cor}$ is used to sum the feedback signal with the input signal through resistor R. The use of a feedback loop eliminates dependencies on temperature and other IC process variations.

Peak detector 46 detects the low frequency wander, preferably by detecting the peaks or envelope of the received signal and provides it as one input to comparison circuit 48. Circuit 48 is preferably an operational transconductance amplifier which compares the input 54 from peak detector 46 to an input 56, which is preferably a reference voltage of 3.5 volts. The output is a current, $i_{cor}(t)$, which is used to charge capacitor C. Thus, the DC value of the received input signal is adjusted to compensate for baseline wander.

Figure 3:
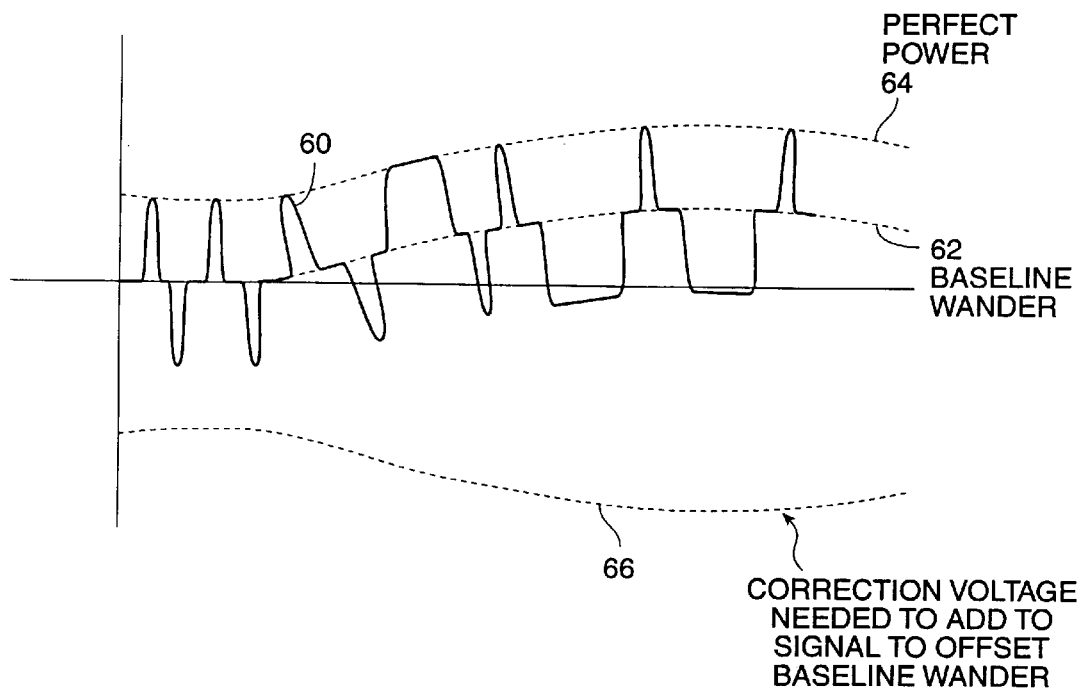
FIG. 3 is a diagram illustrating baseline wander for an MLT-3 signal.

FIG. 3 is a diagram illustrating baseline wander. An MLT-3 data signal 60 is shown as having peaks, mid-levels and negative levels to indicate three different encoding possibilities. A dotted line 62 illustrates the variation of the baseline or mid-level value from the ideal, zero level. As this varies, the positive and negative peaks vary accordingly. Dotted line 64 shows the variation of the positive peaks, which would be detected by peak detector 46 of FIG. 2. The DC voltage added back to correct for the baseline wander is shown by a dotted line 66, which would be the voltage set by voltage correction circuit 50 of FIG. 2.

In one embodiment, equalizer 42 adjusts the voltage level of the received data so that some DC level always needs to be added back, even when there is no baseline wander. This enables capacitor C to either be charged or discharged to correct in two directions for baseline wander. Alternately, two different circuits could be used according to the present invention, one for detecting positive peaks, and another for negative peaks, with a reversal of the connections shown in FIG. 2.

The equations describing the operation of the feedback loop according to the present will now be described.

$$v(t) = v_{eq}(t) \cdot \frac{R_{cor}}{R + R_{cor}} + v_{cor}(t) \cdot \frac{R}{R + R_{cor}} \quad (1)$$

$$v_p(t) = \text{Envelope}(v(t)) \quad (2)$$

$$v_{cor} = \int \left( \frac{i_{cor}(t)}{C} \right) dt \quad (3)$$

It can be shown the ota (operational transconductance amplifier 48 in FIG. 2) has a transfer function as follows:

$$i_{cor}(t) = (-3.51 \tanh (11.3 (v_p(t) - 3.5 \text{ V}))) \, \mu A \quad (4)$$

If we let $$\frac{R}{R + R_{cor}} = \alpha \quad (5)$$

after some algebra, we have $$v(t) = \frac{\alpha}{C} (-3.51 \tanh (11.3 (\text{Envelope}(v(t)) - 3.5\text{V})) \mu A) dt + (1 - \alpha) v_{eq}(t) \quad (6)$$

So, in the steady state (when the peak of v(t)=3.5), we have $$v(t) = (1-\alpha) v_{eq}(t) \quad (7)$$

To understand the operation of this feedback loop, imagine that $v_{eq}(t)$ varies slowly enough so that $v_p(t) = v(t)$. Then Eq. 6 becomes:

$$v(t) = \frac{\alpha}{C} \int (-3.51 \tanh(11.3(v(t) - 3.5\text{V})) \mu A) dt + (1 - \alpha) v_{eq}(t) \quad (8)$$

Figure 4:
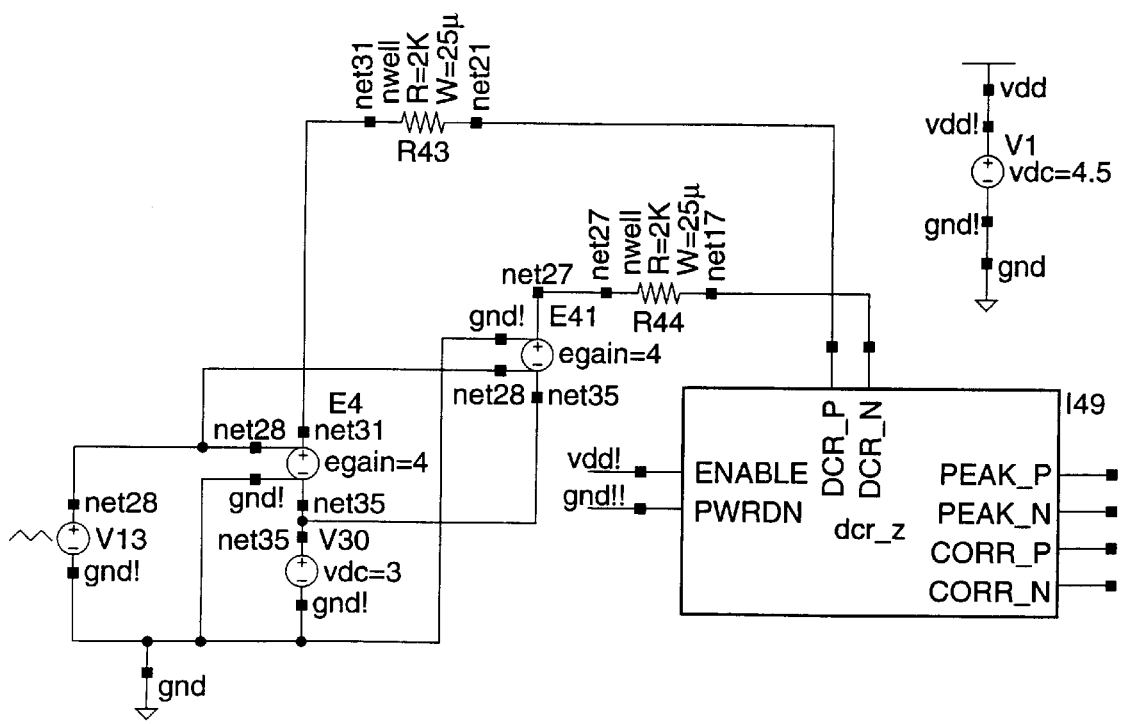
FIG. 4 is an overall circuit diagram illustrating one implementation of the embodiment of FIG. 2.
Figure 5:
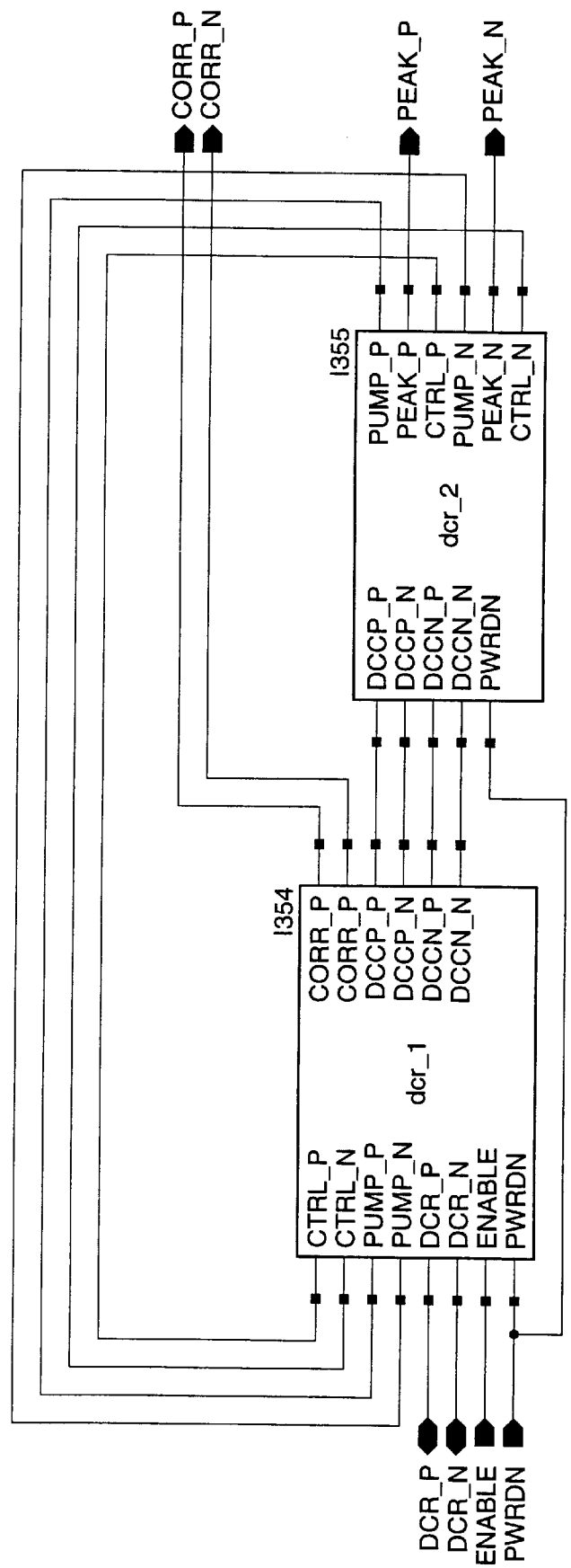
FIG. 5 is a diagram of the dcr_z block of FIG. 4.
Figure 6:
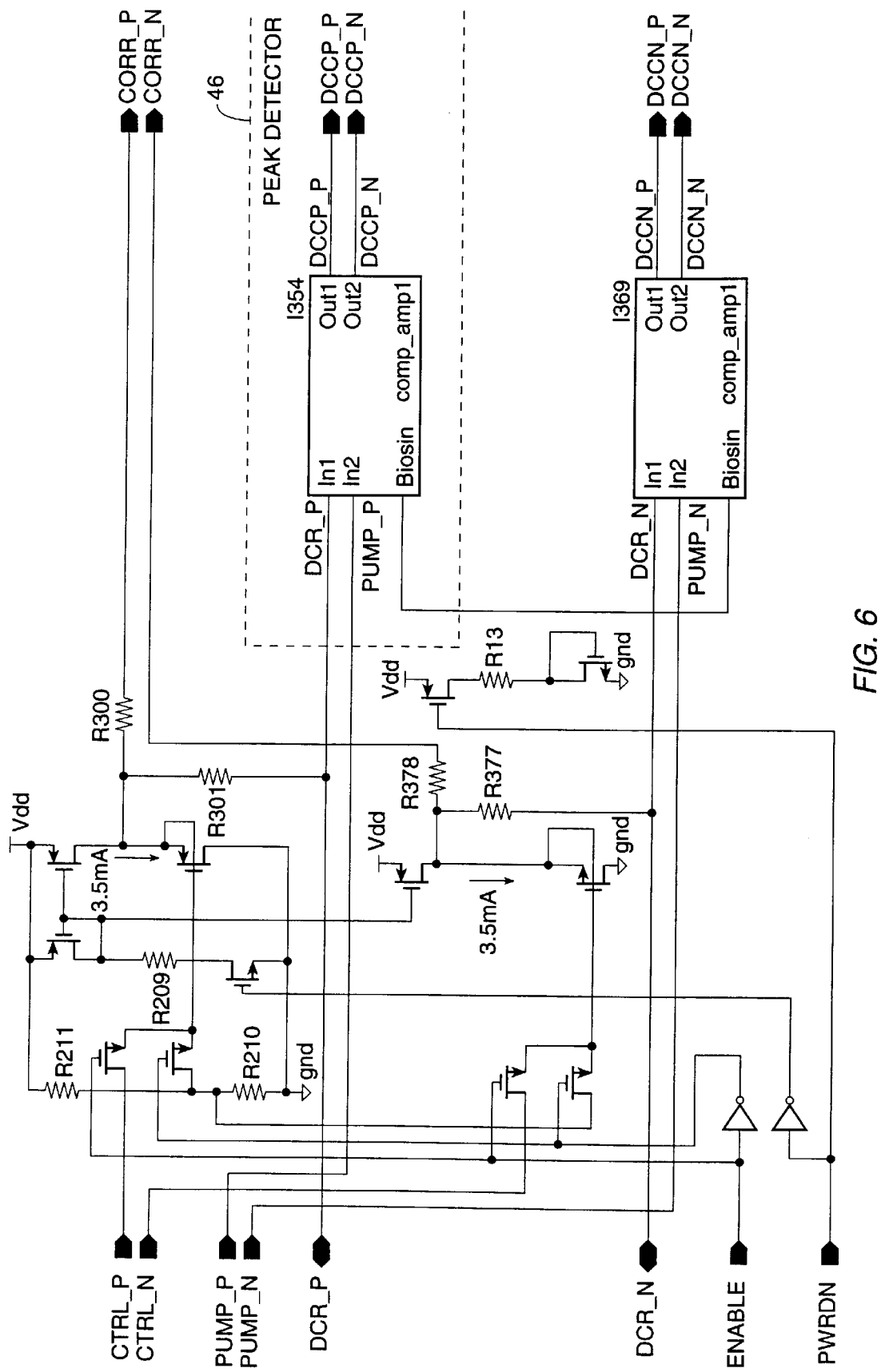
FIG. 6 is a block diagram of the dcr_1 block of FIG. 5.
Figure 7:
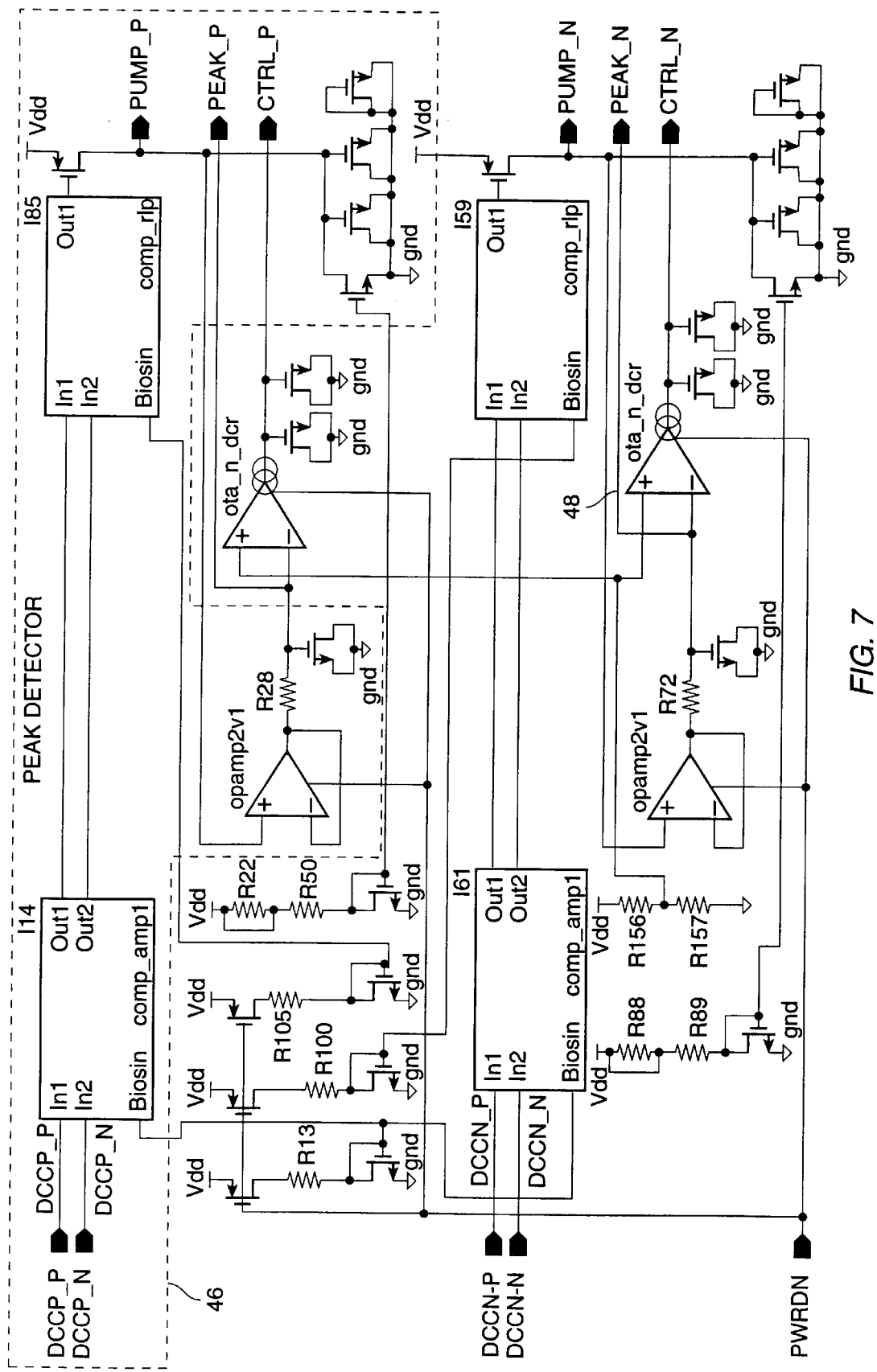
FIG. 7 is a circuit diagram of the dcr_2 block of FIG. 5.
Figure 8:
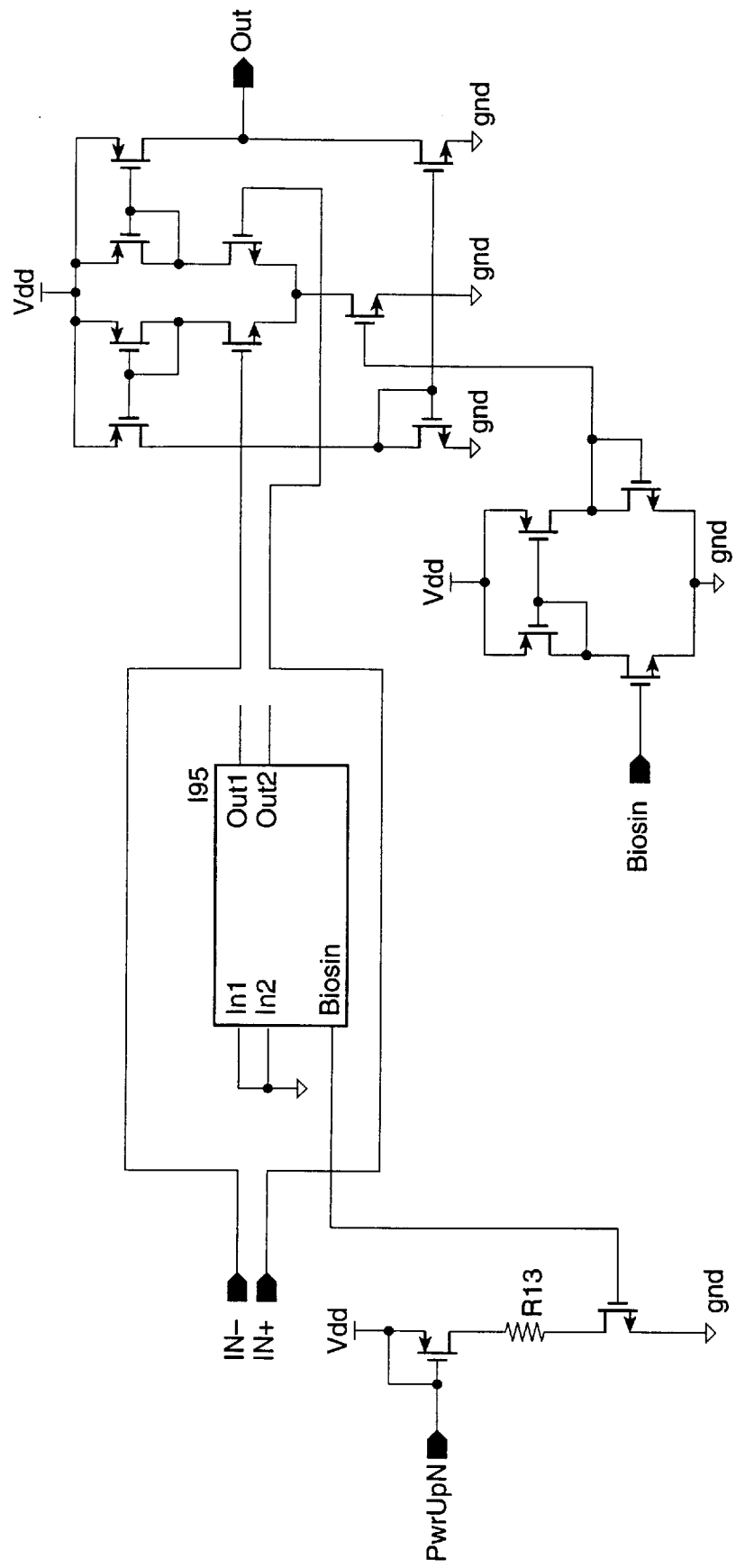
FIG. 8 is a diagram of the operational transconductance amplifier, ota_n_dcr of FIG. 7.
Figure 9:
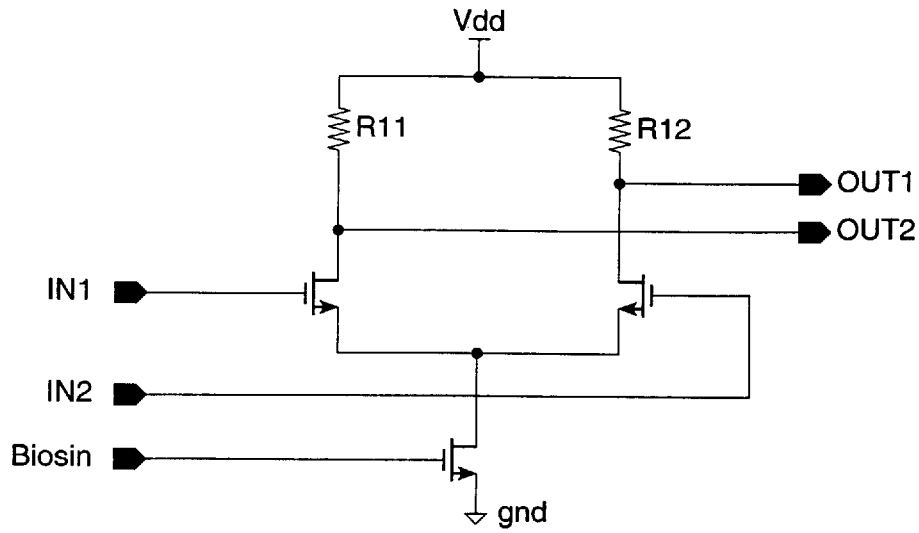
FIG. 9 is a circuit diagram of the comparator comp_amp1 of FIG. 7.
Figure 10:
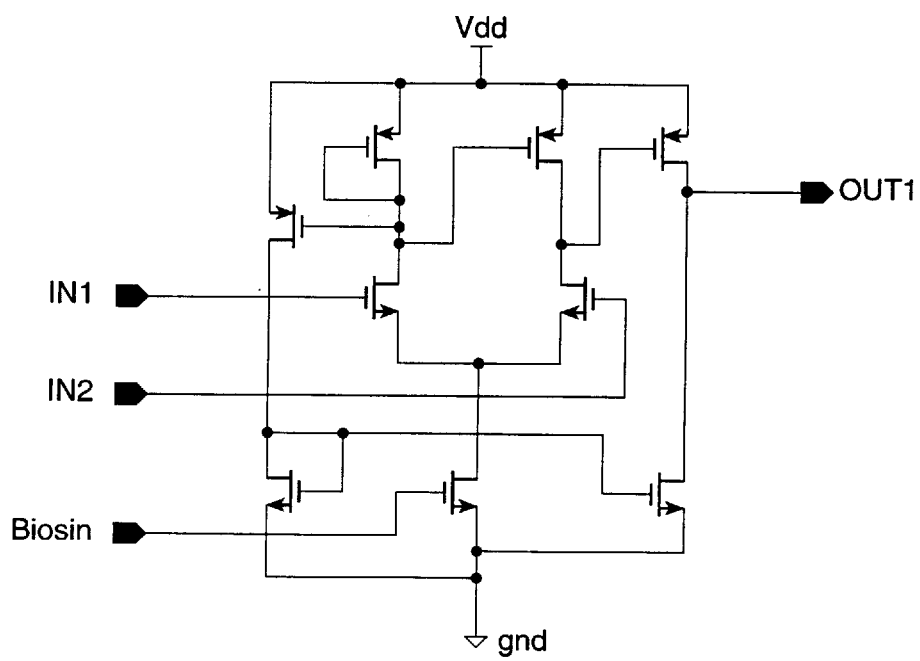
FIG. 10 is a circuit diagram of comp_rip of FIG. 7.

The detailed circuit diagrams illustrating one embodiment of the circuit of FIG. 2 are shown in FIGS. 4–10. FIG. 4 illustrates the overall circuit, while FIG. 5 shows the two blocks which make up dcr_z of FIG. 4. The dcr_1 block of FIG. 5 is shown in FIG. 6 in more detail, while the dcr_2 block is shown in FIG. 7. Indicated by dotted line box 46, which extends across FIGS. 6 and 7, is the peak detector of FIG. 2. The operational transconductance amplifier 48 of FIG. 2 is also indicated in FIG. 7. FIGS. 8–10 include additional detail of blocks from FIGS. 6, 7 and 8.

In a preferred embodiment, $v_{cor}(t)$ of FIG. 2 is set to be approximately 1.5v when no correction is required. This level allows movement up or down to correct as needed.

In a high speed application, data can be transferred at 125 MHz, with a fundamental frequency of one-quarter of that, 31.25 MHz. Four bits of information can be encoded at this rate. The encoding scheme ensures that no more than 60 bits will pass without a transition. Thus, for the slowest expected data, approximately 2 MHz would be the slowest rate at which transitions would occur. Thus, the DC restoration circuit should not follow transitions which are that fast, but should follow transitions up to 100 KHz, the rate at which DC wander is observed to occur. This rate is built into peak detector 46.

As will be understood by those of skill in the art, the present invention can be embodied in other specific forms without departing from the spirit or essential characteristics thereof. For example, the DC restoration circuit could be referenced to a high level, rather than ground, or to a negative voltage level. In addition, the peak detector could detect peaks at a higher rate, but the comparison circuit could respond more slowly so that the feedback does not occur for the slow data rates. Accordingly, the above descriptions are intended to be illustrative of the invention, but not limiting, and reference should be made to the following claims for setting forth the scope of the invention.

What is claimed is:

1. A DC restoration circuit for a data receiver, comprising:
    a received data line configured to receive a multi-level transmission;
    a voltage correction circuit coupled to said received data line and configured to adjust a voltage level of said multi-level transmission;
    a feedback circuit having an input connected to said data line and an output coupled to a control input of said voltage correction circuit, said feedback circuit including
        a detection circuit configured to detect a baseline wander of received data, and
        a comparison circuit configured to generate a control signal to said control input of said voltage correction circuit in response to a comparison of an output of said detection circuit to a voltage reference;
    a first resistor coupled in series in said received data line; and
    a second resistor coupled to an output node of said first resistor,
        said voltage correction circuit including
        a diode coupled between an output of said comparison circuit and said second resistor, and
        a capacitor coupled between said output of said comparison circuit and ground.

2. A DC restoration circuit for a data receiver, comprising:
    a first resistance coupling a received data line to a correction node;
    a baseline wander detector having an input coupled to said correction node;
    a comparison circuit having a first input coupled to an output of said baseline wander detector, a second input coupled to a reference voltage, and an output;
    a capacitor coupled to said output of said comparison circuit; and
    a second resistor coupled between said output of said comparison circuit and said correction node.

3. The DC restoration circuit of claim 2 wherein said baseline wander detector is configured to have a response time greater than a DC wander range and less than a slowest data rate.

4. The DC restoration circuit of claim 2 wherein said comparison circuit comprises an operational transconductance amplifier.

5. The DC restoration circuit of claim 4 further comprising a buffer connected between said second resistor and said capacitor.

6. A data transceiver comprising:

a data receiver input;

an equalizer coupled to said data receiver input;

a first resistor having a first node coupled to an output of said equalizer;

a slicer circuit coupled to a second node of said first resistor;

a voltage correction circuit connected to said second node and configured to adjust a voltage level of the received data;

a feedback circuit having an input coupled to said second node and an output coupled to a control input of said voltage correction circuit, said feedback circuit including a detection circuit configured to detect a low frequency voltage level of received data, and a comparison circuit configured to generate a control signal to said control input of said voltage correction circuit in response to a comparison of an output of said detection circuit to a voltage reference.

7. The transceiver of claim 6 wherein said feedback circuit is configured to have a response time greater than a DC wander range and less than a slowest data rate.

8. The transceiver of claim 6 wherein said detection circuit comprises a peak detector for detecting an envelop of said received data.

9. The transceiver of claim 6 wherein said comparison circuit comprises an operational transconductance amplifier.

10. The transceiver of claim 6 further comprising a second resistor coupled to an output node of said first resistor, and wherein said voltage correction circuit comprises:

a buffer coupled between an output of said comparison circuit and said second resistor, and a capacitor coupled between said output of said comparison circuit and ground.

* * * * *